(12) United States Patent
Li (10) Patent No.: US 7,149,998 B2
(45) Date of Patent: Dec. 12, 2006

(54) LITHOGRAPHY PROCESS MODELING OF ASYMMETRIC PATTERNS

(75) Inventor: Xiaoyang Li, Fremont, CA (US)

(73) Assignee: Synopsys Inc., Mountain View, CA (US)

( * ) Notice: Subject to any disclaimer, the term of this patent is extended or adjusted under 35 U.S.C. 154(b) by 341 days.

(21) Appl. No.: 10/335,513

(22) Filed: Dec. 30, 2002

(65) Prior Publication Data

US 2004/0126672 A1  Jul. 1, 2004

(51) Int. Cl.
*G06F 17/50* (2006.01)
(52) U.S. Cl. .......................... 716/19; 716/21
(58) Field of Classification Search ............... 716/1–4, 716/18–21; 430/5, 22, 30
See application file for complete search history.

(56) References Cited

U.S. PATENT DOCUMENTS

| 6,114,096 | A * | 9/2000 | Mih et al. ............ 430/311 |
| 6,185,727 | B1 * | 2/2001 | Liebmann ............ 716/19 |
| 6,524,752 | B1 * | 2/2003 | Pierrat ............ 430/5 |
| 6,584,610 | B1 * | 6/2003 | Wu et al. ............ 716/19 |
| 6,601,231 | B1 * | 7/2003 | LaCour ............ 716/21 |
| 6,675,369 | B1 * | 1/2004 | Lukanc et al. ............ 716/21 |
| 6,698,008 | B1 * | 2/2004 | McCullen et al. ............ 716/19 |
| 6,842,889 | B1 * | 1/2005 | Dulman et al. ............ 716/19 |
| 6,887,625 | B1 * | 5/2005 | Baselmans et al. ............ 430/5 |
| 6,953,643 | B1 * | 10/2005 | Bourdillon ............ 430/5 |
| 2002/0015900 | A1 * | 2/2002 | Petersen ............ 430/5 |
| 2004/0031013 | A1 * | 2/2004 | Dulman et al. ............ 716/19 |

* cited by examiner

*Primary Examiner*—Vuthe Siek
*Assistant Examiner*—Binh Tat
(74) *Attorney, Agent, or Firm*—Bever, Hoffman & Harms, LLP; Jeanette S. Harms (57) ABSTRACT

A lithography process model is generated to account for asymmetric printing of a feature of a target pattern to help better predict how the target pattern will print. The process model for one embodiment may be generated based on data generated from measurements of spacings between symmetrically defined features of printed test patterns to help predict edge offsets of the feature relative to the target pattern when printed and/or to help predict a dimension of the feature when printed. The process model may be used to help design, manufacture, and/or inspect a mask to help print the target pattern more accurately and therefore help manufacture an integrated circuit (IC), for example, that more accurately matches its intended layout.

20 Claims, 4 Drawing Sheets

LITHOGRAPHY PROCESS MODELING OF ASYMMETRIC PATTERNS

BACKGROUND

1. Field of the Invention

The present invention relates generally to the field of lithography processing. More particularly, the present invention relates to the field of lithography process modeling.

2. Description of Related Art

Lithography process modeling may be used to account for process effects at various stages in manufacturing integrated circuits (ICs), for example, to help produce ICs that more accurately match their intended layout. Process modeling therefore helps increase IC yield and/or allows ICs to be designed with relatively smaller features to help increase performance and reduce power consumption.

Process models may be used to help account for optical proximity effects, phase shifting effects, distortions introduced by resist processes, and/or etching process effects, for example, in performing optical proximity correction (OPC), phase shifting, silicon verification, and/or mask defect prediction, for example. The N-abled™ Process developed by Numerical Technologies, Inc. of San Jose, Calif., for example, enables the generation of such process models.

A process model may be initially generated from various stepper and optical lithography parameters that are to be used in printing a target pattern. To account for optical and/or chemical effects not captured in the initial model, the model may be calibrated based on actual linewidth measurements on wafer of test patterns printed using those parameters. The calibrated model may then be used, for example, to help predict one or more critical dimensions (CDs) for the target pattern in designing, manufacturing, and/or inspecting a mask to print the target pattern.

As one example, a process model may be used to help predict the printed width of a polysilicon line of a target pattern. If the line is to be printed using phase shifting proximate to and on only one side of the line, however, the line will be printed asymmetrically, that is with different edge offsets, relative to the target pattern. Because the model does not account for such asymmetric printing of features and therefore presumes features will be printed symmetrically, that is with substantially the same edge offsets relative to the target pattern, any resulting mask may not print the target pattern with sufficient accuracy because the line will be printed in a position different than that expected from the model.

The performance of OPC on the target pattern using the model may therefore lead to contact misplacement, bridging, and/or a minimum spacing violation, for example. Because such error conditions may not be revealed until a mask is manufactured and either inspected or used to print the target pattern, any resulting mask and the time and resources expended to manufacture and inspect the mask may be wasted unless the mask can be repaired. This is so even if the resulting mask layout is verified against the target pattern by simulating the printing of the mask layout because the simulated printing of the mask layout will be based on the same model.

SUMMARY

Methods and apparatuses for lithography process modeling of asymmetric patterns are described. A lithography process model is generated to account for asymmetric printing of a feature of a target pattern to help better predict how the target pattern will print. The process model may therefore be used to help design, manufacture, and/or inspect a mask to help print the target pattern more accurately and therefore help manufacture an integrated circuit (IC), for example, that more accurately matches its intended layout.

For one method, data is received to account for asymmetric printing of a feature of a pattern. A process model is generated based on the received data to help predict how the pattern will print.

For one embodiment, data resulting from a first measurement of a first spacing between two features of a printed first test pattern and from a second measurement of a second spacing between two features of a printed second test pattern is received.

The first test pattern for one embodiment is printed using one mask defining a phase shifter to expose a region of a layer over a substrate to radiation through the phase shifter and another mask to define in the layer two features on generally opposite sides of the exposed region.

The second test pattern for one embodiment is printed using one mask defining two phase shifters to expose respective regions of a layer over a substrate to radiation through the two phase shifters and using another mask to define two features in the layer generally between the two exposed regions with one feature proximate to one of the two exposed regions and the other feature proximate to the other one of the two exposed regions.

The process model for one embodiment may be used to perform optical proximity correction (OPC) on a layout. The process model may therefore be used to help minimize or avoid creating a contact misplacement, bridging, or a minimum spacing violation, for example, in performing OPC.

The process model for one embodiment may be used to simulate how a mask layout will print. The process model may therefore be used to help identify errors, such as out-of-tolerance regions for example, in a mask layout more accurately when verifying the simulated print against, for example, an integrated circuit layout.

The process model for one embodiment may be used to simulate how a mask will print. The process model may therefore be used to help assess the severity of any defects and contaminants in a mask with more accuracy.

A computer-readable medium having instructions which, when executed by a computer system, cause the computer system to perform the method is also described.

An apparatus comprises means for receiving data to account for asymmetric printing of a feature of a pattern and means for generating a process model based on the received data to help predict how the pattern will print.

For one embodiment, the receiving means comprises means for receiving data resulting from a first measurement of a first spacing between two features of a printed first test pattern and from a second measurement of a second spacing between two features of a printed second test pattern.

The apparatus for one embodiment comprises means for performing optical proximity correction on a layout using the process model. The apparatus for one embodiment comprises means for simulating how a mask layout will print using the process model. The apparatus for one embodiment comprises means for simulating how a mask will print using the process model.

A system comprises a model generator to generate a process model and a model calibrator to calibrate the process model to account for asymmetric printing of a feature.

For one embodiment, the model calibrator is to calibrate the process model based on data resulting from a first measurement of a first spacing between two features of a printed first test pattern and from a second measurement of a second spacing between two features of a printed second test pattern.

The system for one embodiment comprises an optical proximity correction tool to perform optical proximity correction on a layout using the process model. The system for one embodiment comprises a layout verification tool to simulate how a mask layout will print using the process model. The system for one embodiment comprises a mask inspection tool to simulate how a mask will print using the process model.

A mask is manufactured in accordance with a mask layout produced by performing optical proximity correction on a layout defining a pattern using a process model that accounts for asymmetric printing of a feature of the pattern.

An integrated circuit comprises a layer over a substrate. The layer comprises a feature defined by performing optical proximity correction on a layout using a process model that accounts for asymmetric printing of the feature.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

The following detailed description sets forth an embodiment or embodiments in accordance with the present invention for lithography process modeling of asymmetric patterns.

Embodiments of the invention include methods, apparatuses, systems, and computer-readable media having instructions for generating a lithography process model that accounts for asymmetric printing of one or more features of a target pattern to help better predict how the target pattern will print. Embodiments of the invention also include methods, apparatuses, systems, and computer-readable media having instructions for using a lithography process model that accounts for asymmetric printing of one or more features of a target pattern to help design, manufacture, and/or inspect a mask to help print the target pattern more accurately and therefore help manufacture an integrated circuit (IC), for example, that more accurately matches its intended layout. Embodiments of the invention also include masks, mask sets, and integrated circuits (ICs) manufactured using a lithography process model that accounts for asymmetric printing of one or more features.

An example of a feature that prints asymmetrically is first described with reference to FIGS. 1 and 2. Embodiments of the invention are then described, with reference to FIGS. 3, 4, and 5, in the context of how a lithography process model is generated to account for asymmetric printing of one or more features, using the feature of FIGS. 1 and 2 as an example. Embodiments of the invention are then described, with reference to FIG. 6, in the context of a system that generates and uses a lithography process model that accounts for asymmetric printing of one or more features to help manufacture an integrated circuit (IC) that more accurately matches its intended layout.

Example Asymmetric Pattern

Figure 1:
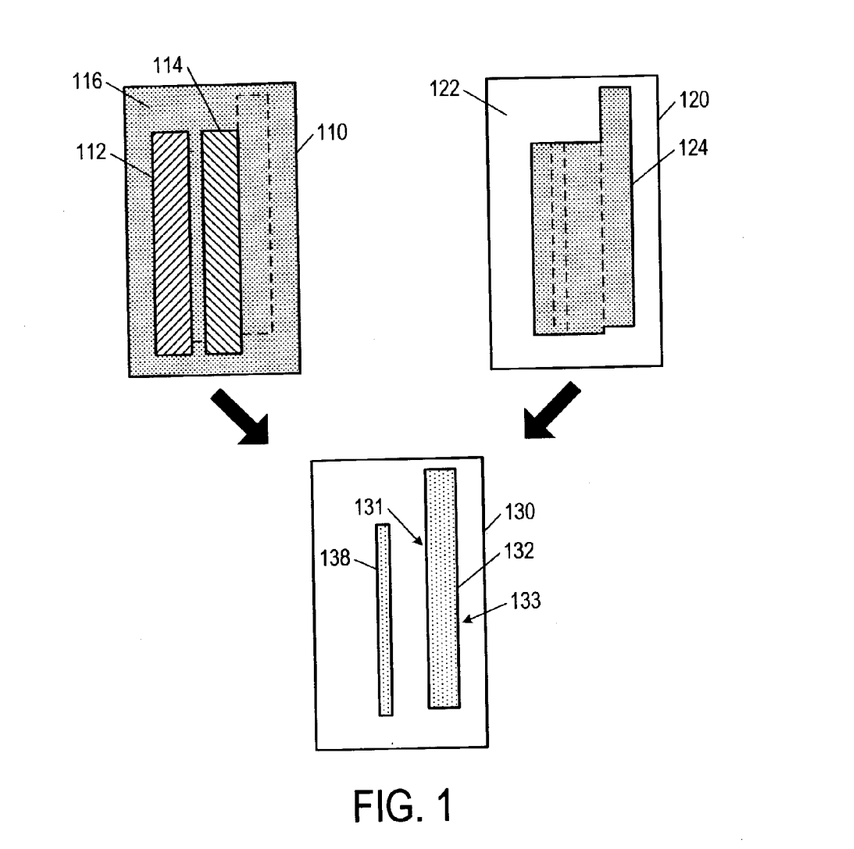
FIG. 1 illustrates an example of a phase-shifting mask (PSM) portion and a trim mask portion to print a line using phase shifting proximate to and on only a single side of the line.

FIG. 1 illustrates an example of a phase-shifting mask (PSM) portion 110 and a trim mask portion 120 that, when used to print a target pattern in a layer 130 over a substrate, cause a feature of the pattern to be printed asymmetrically, that is with different edge offsets, relative to the target pattern. In the example of FIG. 1, PSM portion 110 and trim mask portion 120 cause a line 132 to be printed asymmetrically because PSM portion 110 phase shifts radiation projected onto layer 130 in a region proximate to and on only one side 131 of line 132 as defined by trim mask portion 120. FIG. 2 illustrates the asymmetric printing of line 132.

As illustrated in the example of FIG. 1, PSM portion 110 and trim mask portion 120 are used to print line 132 and another line 138 in layer 130. Layer 130 comprises a suitable radiation-sensitive material, such as a suitable photoresist material for example.

PSM portion 110 is first used to expose layer 130 to suitable radiation, such as visible light or ultra-violet light for example, passing through a phase shifter 112 and a phase shifter 114 to help define line 138 with a width less than the wavelength of the radiation. Phase shifter 112 may be, for example, an approximately 0° phase shifter, and phase shifter 114 may be, for example, an approximately 180° phase shifter. PSM portion 110 defines phase shifters 112 and 114 in a dark field 116 to help prevent radiation from passing through other regions of PSM portion 110 onto layer 130.

Trim mask portion 120 is then used to expose layer 130 to suitable radiation passing through a bright field 122. Trim mask portion 120 defines in bright field 122 a trim region 124 shaped to define lines 132 and 138 and to help protect areas of layer 130 previously exposed to phase shifted radiation through PSM portion 110 from being exposed to radiation projected onto trim mask portion 120.

As the exposure to radiation modifies the molecular composition of layer 130, layer 130 may then be processed to remove the exposed regions to form lines 132 and 138. Line 132 and 138 may then be transferred to an underlying layer by using layer 130 as a mask in selectively etching only those regions of the underlying layer exposed through layer 130. The underlying layer may comprise polysilicon, for example, to form corresponding polysilicon lines for an integrated circuit (IC), for example.

Figure 2:
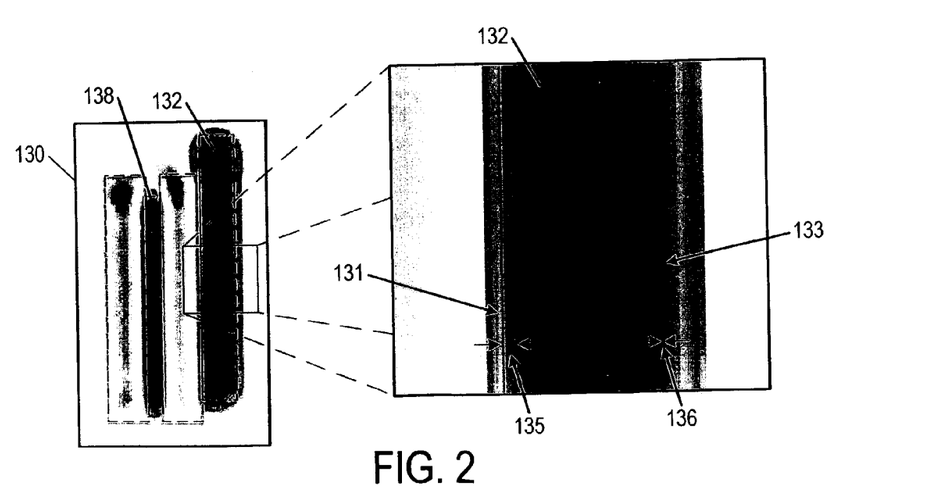
FIG. 2 illustrates the asymmetric printing of the line for the example of FIG. 1.

Because line 132 is proximate to a region of layer 130 exposed to radiation phase shifted through phase shifter 114 on only one side 131 and because line 132 is not proximate to a region of layer 130 exposed to phase shifted radiation on at least one other side, such as a side 133 opposite side 131 for example, line 132 is defined asymmetrically in layer 130 relative to the target pattern as illustrated in FIG. 2. FIG.

2 illustrates how line 132 is defined with side 131 having a larger edge offset 135 as compared to the edge offset 136 on side 133.

Modeling of Asymmetric Patterns

To account for asymmetric printing of a feature of a target pattern, a lithography process model for one embodiment may be generated based on data generated from measurements of spacings between symmetrically defined features of printed test patterns. A test pattern may be designed and printed with generally symmetric features with sides that face one another and that are defined similarly as one side of the feature of the target pattern. The edge offset of the one side of the feature of the target pattern when printed may then be estimated for one embodiment, for example, by measuring the spacing defined by the facing sides of the generally symmetric features of the printed test pattern, subtracting the known distance between the generally symmetric features of the test pattern as defined by its design or layout, and dividing the difference by two. By designing and printing test patterns to estimate edge offsets on opposite sides of the feature of the target pattern when printed, a dimension of the feature defined by the opposite sides of the feature may also be estimated, for example, by subtracting the sum of the estimated edge offsets from the known dimension defined by the design or layout of the target pattern. A lithography process model generated based on such measurements or estimates may therefore be used to help better predict how the target pattern will print.

Figure 3:
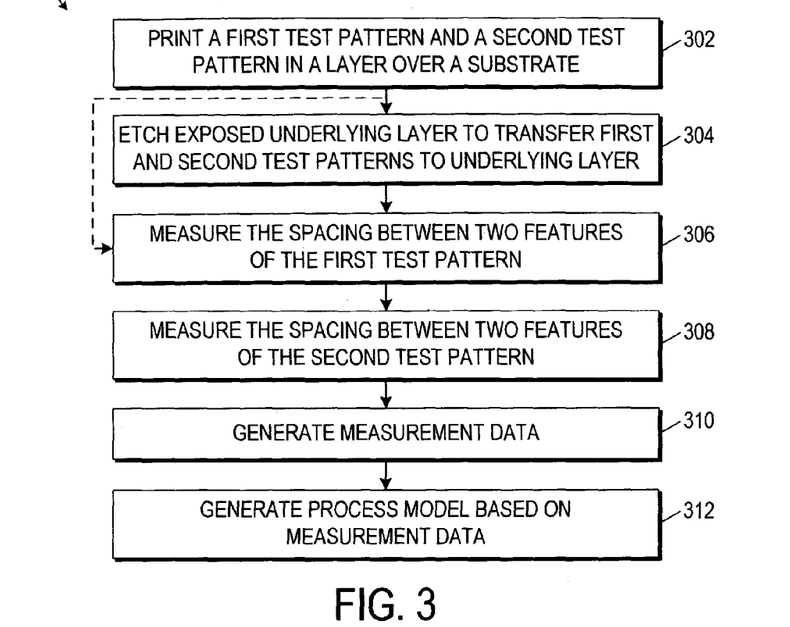
FIG. 3 illustrates, for one embodiment, a flow diagram for generating a lithography process model that accounts for the asymmetric printing of a feature.

FIG. 3 illustrates, for one embodiment, a flow diagram 300 to generate a lithography process model that accounts for the asymmetric printing of a feature. Although described in the context of being generated to account for the asymmetric printing of line 132 of FIG. 1 due to the proximity of line 132 to a region exposed to phase shifted radiation on only one side 131, a lithography process model may be generated in accordance with flow diagram 300 to account for the asymmetric printing of any suitable one or more features of any suitable target pattern due to any suitable circumstance.

For block 302 of FIG. 3, a first test pattern and a second test pattern are printed in a layer over a substrate. The first and second test patterns used may depend, for example, on the feature of the target pattern to be printed. The first test pattern for one embodiment may be designed and printed with generally symmetric features with sides that face one another and that are defined similarly as one side of the feature of the target pattern. The second test pattern for one embodiment may be designed and printed with generally symmetric features with sides that face one another and that are defined similarly as an opposite side of the feature of the target pattern. The dimensions of features of the first and second test patterns may depend, for example, on the anticipated size of the feature of the target pattern to be printed.

The first and second test patterns for one embodiment may be printed in a layer of the same or similar material in accordance with a predetermined set of lithography process parameters to be used to print the target pattern. Suitable lithography process parameters include, without limitation, stepper specifications such as wavelength ($\lambda$), numerical aperture (NA), and incoherence factor ($\sigma$), for example; illumination; photoresist; thin film; aberrations; multiple exposures; process analysis; and/or multiple mask types.

Figure 4:
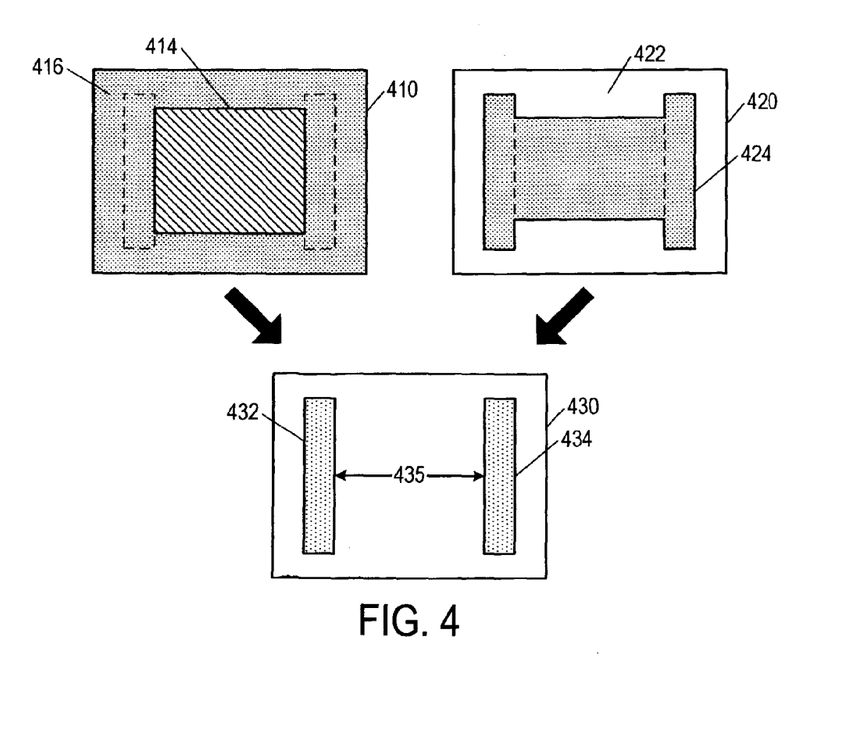
FIG. 4 illustrates an example of a PSM portion and a trim mask portion to print a first test pattern for the flow diagram of FIG. 3.

FIG. 4 illustrates one example of a first test pattern that may be used to help account for the asymmetric printing of line 132 of FIG. 1. The first test pattern in the example of FIG. 4 comprises two generally parallel lines 432 and 434 printed in a layer 430 using a PSM portion 410 and a trim mask portion 420. PSM portion 410 and trim mask portion 420 for one embodiment are designed and manufactured in accordance with a first test pattern layout, for example, in GDS-II stream format.

As illustrated in FIG. 4, PSM portion 410 defines a phase shifter 414 in a dark field 416 to expose a region of layer 430 to radiation passing through phase shifter 414. Phase shifter 414 for one embodiment shifts the phase of radiation passing through phase shifter 414 similarly as phase shifter 114 in FIG. 1. Trim mask portion 420 defines in a bright field 422 a trim region 424 shaped to define lines 432 and 434 in layer 430 in a generally parallel relationship and proximate to and on generally opposite sides of the region in layer 430 exposed to radiation through PSM portion 410. Trim region 424 also helps protect areas of layer 430 previously exposed to radiation through PSM portion 410 from being exposed to radiation projected onto trim mask portion 420.

The first test pattern for one embodiment may be used to model the edge offset for side 131 of line 132 of FIG. 1 when printed because PSM portion 410 and trim mask portion 420 define the sides of lines 432 and 434 that face one another similarly as side 131 of line 132 of FIG. 1, that is with phase shifting proximate to and on only the same one side 131 of line 132.

Although described as using PSM portion 410 first and then using trim mask portion 420 to print the first test pattern, trim mask portion 420 for another embodiment may be used prior to using PSM portion 410.

Figure 5:
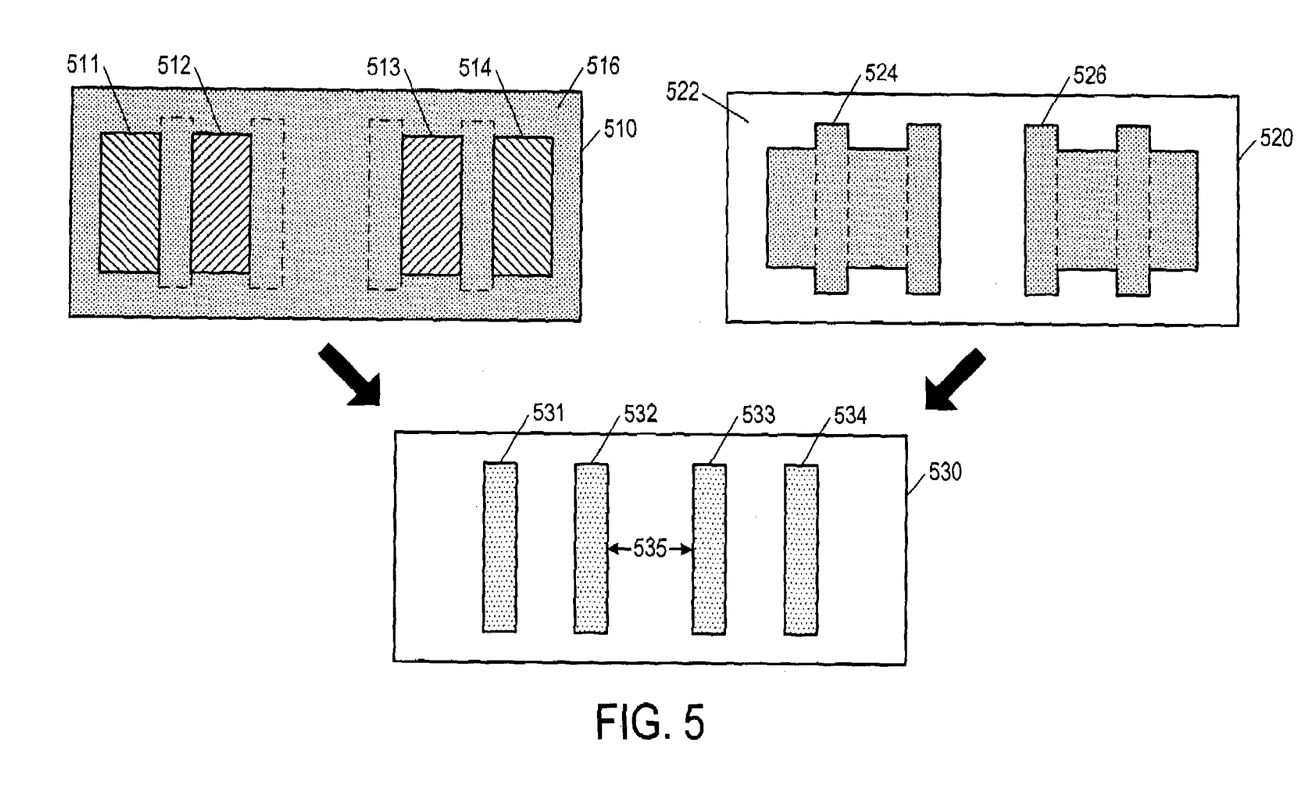
FIG. 5 illustrates an example of a PSM portion and a trim mask portion to print a second test pattern for the flow diagram of FIG. 3.

FIG. 5 illustrates one example of a second test pattern that may be used to help account for the asymmetric printing of line 132 of FIG. 1. The second test pattern in the example of FIG. 5 comprises four generally parallel lines 531, 532, 533, and 534 printed in a layer 530 using a PSM portion 510 and a trim mask portion 520. PSM portion 510 and trim mask portion 520 for one embodiment are designed and manufactured in accordance with a second test pattern layout, for example, in GDS-II stream format.

As illustrated in FIG. 5, PSM portion 510 defines phase shifters 511, 512, 513, and 514 in a dark field 516 to expose regions of layer 530 to radiation passing through phase shifters 511–514. Phase shifters 511 and 514 for one embodiment shift the phase of radiation passing through phase shifter 511 and 514, respectively, similarly as phase shifter 112 in FIG. 1. Phase shifters 512 and 513 for one embodiment shift the phase of radiation passing through phase shifter 512 and 513, respectively, similarly as phase shifter 114 in FIG. 1.

Trim mask portion 520 defines trim regions 524 and 526 in a bright field 522. Trim region 524 is shaped to define line 531 in layer 530 proximate to and between regions exposed to radiation through phase shifters 511 and 512 of PSM portion 510. Trim region 524 is also shaped to define lines 531 and 532 in layer 530 in a generally parallel relationship and proximate to and on generally opposite sides of the region exposed to radiation through phase shifter 512 of PSM portion 510. Trim region 526 is shaped to define line 534 in layer 530 proximate to and between regions exposed to radiation through phase shifters 513 and 514 of PSM portion 510. Trim region 526 is also shaped to define lines 533 and 534 in layer 530 in a generally parallel relationship and proximate to and on generally opposite sides of the region exposed to radiation through phase shifter 513 of PSM portion 510. Trim mask portion 520 defines trim regions 524 and 526 to define lines 532 and 533 in a generally parallel relationship generally between the regions exposed to radiation through phase shifters 512 and 513 of PSM portion 510 with line 532 proximate to the region exposed to radiation through phase shifter 512 and with line 533 proximate to the region exposed to radiation through phase shifter 513. Trim regions 524 and 526 also help protect areas of layer 530 previously exposed to radiation through PSM portion 510 from being exposed to radiation projected onto trim mask portion 520.

The second test pattern for one embodiment may be used to model the edge offset for side 133 of line 132 of FIG. 1 when printed because PSM portion 510 and trim mask portion 520 define the sides of lines 532 and 533 that face one another similarly as side 133 of line 132 of FIG. 1, that is with phase shifting proximate to and on only the opposite one side 131 of line 132.

Although described as using PSM portion 510 first and then using trim mask portion 520 to print the second test pattern, trim mask portion 520 for another embodiment may be used prior to using PSM portion 510.

For one embodiment for block 302 of FIG. 3, PSM portion 410 of FIG. 4 and PSM portion 510 of FIG. 5 are portions of the same PSM, and trim mask portion 420 of FIG. 4 and trim mask portion 520 of FIG. 5 are portions of the same trim mask.

For another embodiment, PSM portion 410 and PSM portion 510 are portions of different masks, and trim mask portion 420 and trim mask portion 520 are portions of different masks. The first test pattern and the second test pattern for one embodiment may then be printed on layers over different substrates.

For block 304 of FIG. 3, an underlying layer exposed through the layer printed with the first and second test patterns may be etched using a suitable etching process to transfer the first and second test patterns to the underlying layer. The underlying layer for one embodiment may comprise the same or similar material as that of the layer to be patterned with the target pattern. For one embodiment where the target pattern is to be transferred to a layer comprising polysilicon, for example, the first and second test patterns for block 304 may be transferred to a layer comprising polysilicon. The etching process to transfer the first and second test patterns to an underlying layer for one embodiment may be the same or a similar etching process to be used in similarly transferring the target pattern to an underlying layer.

Performing operations for block 304 helps capture etching process effects in generating a process model and therefore may be done to help better predict how a target pattern will print. Performing operations for block 304 is nevertheless optional as a layer printed with the first and second test patterns without being subjected to an etching process may also be used in generating a process model.

For another embodiment where the first test pattern and the second test pattern are printed on layers over different substrates, operations for block 304 may be performed to transfer the first and second test patterns onto respective underlying layers over their respective substrates.

For block 306 of FIG. 3, the spacing between the two generally symmetrically defined features of the first test pattern is measured. This spacing may be measured in any suitable manner using any suitable equipment. The spacing may, for example, be measured manually or automatically using suitable equipment comprising a scanning electron microscope (SEM).

Using the example test pattern of FIG. 4, a spacing 435 defined by the sides of lines 432 and 434 facing one another is measured. Spacing 435 spans the region of layer 430 previously exposed to radiation through PSM portion 410. As side 131 of line 132 of FIG. 1 is also proximate to a region previously exposed to phase shifted radiation, the measurement of spacing 435 in the actual printed test pattern may be used to help model the edge offset at side 131 of line 132 relative to its target pattern when printed.

For one embodiment where the first test pattern is transferred to an underlying layer, the spacing between features of either the layer printed with the first test pattern for block 302 or of the underlying layer may be measured.

For block 308 of FIG. 3, the spacing between the two generally symmetrically defined features of the second test pattern is measured. This spacing may be measured in any suitable manner using any suitable equipment. The spacing may, for example, be measured manually or automatically using suitable equipment comprising a scanning electron microscope (SEM).

Using the example test pattern of FIG. 5, a spacing 535 defined by the sides of lines 532 and 533 facing one another is measured. Spacing 535 spans the region of layer 530 on an opposite side of line 532 from the region of layer 530 previously exposed to radiation through phase shifter 512 and on an opposite side of line 533 from the region of layer 530 previously exposed to radiation through phase shifter 513. As side 133 of line 132 of FIG. 1 is similarly opposite the side 131 of line 132 proximate to a region previously exposed to phase shifted radiation, the measurement of spacing 535 in the actual printed test pattern may be used to help model the edge offset at side 133 of line 132 relative to its target pattern when printed.

For one embodiment where the second test pattern is transferred to an underlying layer, the spacing between features of either the layer printed with the second test pattern for block 302 or of the underlying layer may be measured.

For block 310 of FIG. 3, data resulting from the measurements of the first and second test patterns is generated. Any suitable data may be generated from measurements of the first and second test patterns. For one embodiment, the values of the measurements are generated in the form of digital signals. For another embodiment, estimated values of printed edge offsets are calculated from the measurements and generated in the form of digital signals. An estimated value of a printed edge offset for one embodiment may be manually or automatically calculated, for example, by subtracting the known distance between the generally symmetric features of a test pattern as defined by its layout from the measured spacing between the generally symmetric features of the corresponding printed test pattern and dividing the difference by two.

The generated measurement data for one embodiment is arranged or stored in a measurement file. For one embodiment, measurement data may be manually entered into a measurement file. For another embodiment, measurement data may be automatically entered into a measurement in response to the generation of the measurement data. As one example, equipment used to perform measurements may interface with a computer system to transmit values of measurements to the computer system. The computer system for one embodiment may then automatically enter the measurement values into a measurement file. The computer system for another embodiment may automatically calculate estimated edge offset values and enter them into a measurement file.

For block 312, a lithography process model is generated based on the measurement data generated for block 310. The process model may be generated in any suitable manner based on the measurement data generated for block 310. The process model for one embodiment may be generated by generating an initial optical model from a predetermined set of lithography process parameters and calibrating the initial optical model based on the measurement data. The process model for another embodiment may be generated by receiving an initial process model and calibrating the received process model based on the measurement data. The initial process model may either be an optical model newly generated from a set of lithography process parameters or a process model previously calibrated based on other measurement data.

The resulting process model may then be used to help predict edge offsets of a feature relative to a target pattern when printed and/or to help predict a dimension of the feature when printed. The resulting process model may therefore be used to help better predict how the target pattern will print.

Although described in the context of blocks 302–312, the operations for flow diagram 300 may be performed in any suitable order. Also, the performance of any suitable operation may or may not overlap in time the performance of any other suitable operation. As one example, operation(s) for block 308 may be performed prior to or as operation(s) for block 306 are performed.

A process model for one embodiment may be generated by executing suitable instructions by one or more processors of a computer system. Such instructions may be stored on any suitable computer-readable medium from which the instructions may be transmitted to the computer system. The computer system may receive instructions from a suitable computer-readable medium that is a part of the computer system and/or from a suitable computer-readable medium external to the computer system at a local or remote location. The computer system may store any data, such as the generated process model for example, on a suitable computer-readable medium that is a part of the computer system and/or on a suitable computer-readable medium external to the computer system at a local or remote location. As used in this description, suitable computer-readable media include, without limitation, a hard disk device, an optical disk device such as a compact disc (CD) or digital versatile disc (DVD) device for example, a Bernoulli disk device such as a Jaz or Zip disk device for example, a flash memory device, a file server, and/or any other suitable memory device.

Example Uses of Modeling of Asymmetric Patterns

A lithography process model that accounts for asymmetric printing of a feature of a target pattern may be used for any suitable purpose. The process model may be used, for example, to help design, manufacture, and/or inspect a mask to help print the target pattern more accurately. The process model may therefore be used to help manufacture an integrated circuit (IC), for example, that more accurately matches its intended layout. Although described in the context of ICs, the present invention may be used to help print target patterns in manufacturing any suitable objects.

Figure 6:
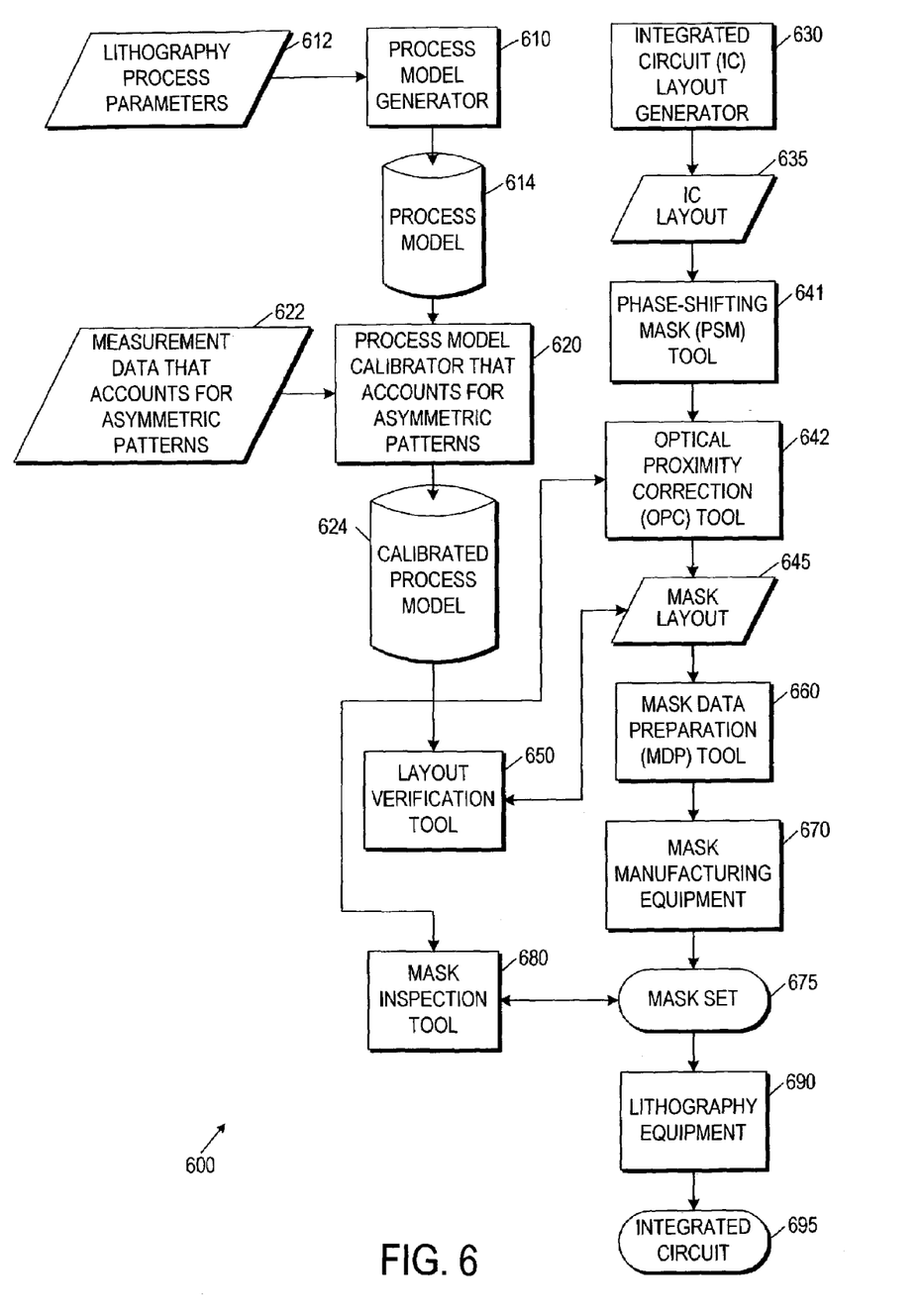
FIG. 6 illustrates, for one embodiment, a system to manufacture an integrated circuit (IC) that more accurately matches its intended layout by using a lithography process model that accounts for the asymmetric printing of one or more features.

FIG. 6 illustrates, for one embodiment, a system 600 to help manufacture an integrated circuit 695 that more accurately matches its intended layout by generating and using a lithography process model that accounts for the asymmetric printing of one or more features. As illustrated in FIG. 6, system 600 comprises a process model generator 610, a process model calibrator 620 that accounts for asymmetric patterns, an integrated circuit layout generator 630, a phase-shifting mask (PSM) tool 641, an optical proximity correction (OPC) tool 642, a layout verification tool 650, a mask data preparation (MDP) tool 660, mask manufacturing equipment 670, a mask inspection tool 680, and lithography equipment 690.

Process model generator 610 receives a predetermined set of lithography process parameters 612 to be used to print a target pattern in manufacturing IC 695. Process model generator 610 generates a preliminary process model 614 based on the predetermined set of lithography process parameters 612.

Process model calibrator 620 receives preliminary process model 614 and measurement data 622 generated from measurements of test patterns printed using the predetermined set of lithography process parameters 612 to account for optical and/or chemical effects not captured by preliminary process model 614. Measurement data 622 for one embodiment includes measurement data generated from measurements of printed test patterns, such as those of FIGS. 4 and 5 for example, to account for asymmetric printing of one or more features. Process model calibrator 620 calibrates preliminary process model 614 based on measurement data 622 to generate calibrated process model 624.

IC layout generator 630 generates an IC layout 635 defining a target pattern for one or more layers of IC 695. PSM tool 641 and OPC tool 642 process the IC layout 635 for a layer to produce a mask layout 645. PSM tool 641 introduces phase-shifting mask (PSM) regions in IC layout 635 to help define features with dimensions less than the wavelength of the radiation to be used in printing IC layout 635. OPC tool 642 applies OPC structures to IC layout 635 to compensate for nonlinear distortions caused by optical diffraction and resist process effects, for example, to help enhance the printability of IC layout 635. OPC tool 642 for one embodiment may use calibrated process model 624 to better predict how IC layout 635 will print in applying OPC structures to IC layout 635.

Layout verification tool 650 verifies mask layout 645 against one or more design rules and/or against IC layout 635. Layout verification tool 650 for one embodiment may simulate how mask layout 645 will print and verify the simulated print against IC layout 635 to help identify any errors, such as out-of-tolerance regions for example. Layout verification tool 650 for one embodiment may use calibrated process model 624 to better predict how mask layout 645 will print.

MDP tool 660 generates mask data based on mask layout 645, and mask manufacturing equipment 670 manufactures one or more masks in a mask set 675 based on the generated mask data.

Mask inspection tool 680 may be used to inspect the manufactured mask(s) of mask set 675 for defects and/or contamination to help ensure IC 695 will function. If a defect or contaminant is identified in a mask, mask inspection tool 680 for one embodiment may simulate how the mask will print and verify the simulated print against IC layout 635 to help assess the severity of the defect or contaminant. Mask inspection tool 680 for one embodiment may use calibrated process model 624 to better predict how a mask will print.

Lithography equipment 690 is used to help print the target pattern defined by IC layout 635 in a corresponding layer of IC 695 using mask set 675. IC 695 is manufactured by printing the target pattern defined by a corresponding IC layout for one or more layers of IC 695.

For one embodiment, process model generator 610, process model calibrator 620, IC layout generator 630, PSM tool 641, OPC tool 642, layout verification tool 650, MDP tool 660, and mask inspection tool 680 may each be implemented in whole or in part by executing suitable instructions by one or more processors of a computer system. Such instructions may be stored on any suitable computer-readable medium from which the instructions may be transmitted to the computer system. The computer system may receive instructions from a suitable computer-readable medium that is a part of the computer system and/or from a suitable computer-readable medium external to the computer system at a local or remote location. The computer system may store any data, such as a process model or layout for example, on a suitable computer-readable medium that is a part of the computer system and/or on a suitable computer-readable medium external to the computer system at a local or remote location.

In the foregoing description, one or more embodiments of the present invention have been described. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
   accessing process data for asymmetric printing of a feature of a pattern; and
   generating a process model based on the process data for predicting how the pattern will print, wherein the process data comprises:
   a first set of measurement data for a first spacing between a first pair of parallel features printed using phase shifting proximate to and between the first pair of parallel features; and
   a second set of measurement data for a second spacing between a second pair of parallel features printed using phase shifting proximate to one side of each of the second pair of parallel features and without using phase shifting proximate to and between the second pair of parallel features.

2. The method of claim 1, wherein the first pair of parallel features is printed using a first mask exposing a region of a layer over a substrate to radiation through a phase shifter and a second mask to define in the layer the first pair of parallel features on generally opposite sides of the region.

3. The method of claim 1, wherein the second pair of parallel features is printed using a first mask exposing a first region and a second region of a layer over a substrate to radiation through a first phase shifter and a second phase shifter, respectively, and using a second mask to define the second pair of parallel features in the layer generally between the first region and the second region, with a first one of the second pair of parallel features proximate to the first region and a second one of the second pair of parallel features proximate to the second region.

4. The method of claim 1, further comprising performing optical proximity correction on a layout using the process model.

5. The method of claim 1, wherein generating the process model comprises calculating an edge offset by dividing by two a difference between the first spacing and an expected distance between the first pair of parallel features.

6. The method of claim 1, wherein generating the process model comprises calculating an edge offset by dividing by two a difference between the second spacing and an expected difference between the second pair of parallel features.

7. A computer-readable medium having instructions which, when executed by a computer system, cause the computer system to perform a method comprising:
   accessing process data to for asymmetric printing of a feature of a pattern; and
   generating a process model based on the process data for predicting how the pattern will print, wherein the process data comprises:
   a first set of measurement data for a first spacing between a first pair of parallel features printed using phase shifting proximate to and between the first pair of parallel features; and
   a second set of measurement data for a second spacing between a second pair of parallel features printed using phase shifting proximate to one side of each of the second pair of parallel features and without using phase shifting proximate to and between the second pair of parallel features.

8. The computer-readable medium of claim 7, wherein the method further comprises performing optical proximity correction on a layout using the process model.

9. The computer-readable medium of claim 7, wherein the generating the process model comprises calculating an edge offset by dividing by two a difference between the first spacing and an expected distance between the first pair of parallel features.

10. The computer-readable medium of claim 7, wherein the generating the process model comprises calculating an edge offset by dividing by two a difference between the second spacing and an expected difference between the second pair of parallel features.

11. An apparatus comprising:
    means for accessing process data for asymmetric printing of a feature of a pattern; and
    means for generating a process model based on the process data for predicting how the pattern will print, wherein the process data comprises:
    a first set of measurement data for a first spacing between a first pair of parallel features printed using phase shifting proximate to and between the first pair of parallel features; and
    a second set of measurement data for a second spacing between a second pair of parallel features printed using phase shifting proximate to one side of each of the second pair of parallel features and without using phase shifting proximate to and between the second pair of parallel features.

12. The apparatus of claim 11, further comprising means for performing optical proximity correction on a layout using the process model.

13. The apparatus of claim 11, wherein the means for generating the process model comprises means for calculating an edge offset by dividing by two a difference between the first spacing and an expected distance between the first pair of parallel features.

14. The apparatus of claim 11, wherein the means for generating the process model comprises means for calculating an edge offset by dividing by two a difference between the second spacing and an expected difference between the second pair of parallel features.

15. A system comprising:
    a model generator to generate a process model; and
    a model calibrator to calibrate the process model to account for asymmetric printing of a feature, wherein the model calibrator is to calibrate the process model based on asymmetric printing data comprising:

a first set of measurement data for a first spacing between a first pair of parallel features printed using phase shifting proximate to and between the first pair of parallel features; and a second set of measurement data for a second spacing between a second pair of parallel features printed using phase shifting proximate to one side of each of the second pair of parallel features and without using phase shifting proximate to and between the second pair of parallel features.

16. The system of claim 15, wherein the first pair of parallel features is printed using a first mask exposing a region of a layer over a substrate to radiation through a phase shifter and a second mask to define in the layer the first pair of parallel features on generally opposite sides of the region.

17. The system of claim 15, wherein the second pair of parallel features is printed using a first mask exposing a first region and a second region of a layer over a substrate to radiation through the a first phase shifter and a second phase shifter, respectively, and using a second mask to define the second pair of parallel features in the layer generally between the first region and the second region, with a first one of the second pair of parallel features proximate to the first region and a second one of the second pair of parallel features proximate to the second region.

18. The system of claim 15, further comprising an optical proximity correction tool for performing optical proximity correction on a layout using the process model.

19. The system of claim 15, further comprising a layout verification tool for simulating how a mask layout will print using the process model.

20. The system of claim 15, comprising a mask inspection tool for simulating how a mask will print using the process model.

* * * * *